United States Patent
Zitlaw et al.

(10) Patent No.: US 9,223,726 B2
(45) Date of Patent: Dec. 29, 2015

(54) APPARATUS AND METHOD FOR PROGRAMMABLE READ PREAMBLE WITH TRAINING PATTERN

(75) Inventors: Clifford Alan Zitlaw, Chico, CA (US); Anthony Le, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 160 days.

(21) Appl. No.: 12/879,936

(22) Filed: Sep. 10, 2010

(65) Prior Publication Data

US 2012/0066464 A1 Mar. 15, 2012

(51) Int. Cl.
| | | |
|---|---|---|
| G06F 3/00 | (2006.01) | |
| G06F 12/16 | (2006.01) | |
| G11C 16/00 | (2006.01) | |
| G08B 5/22 | (2006.01) | |
| G06F 11/10 | (2006.01) | |
| G11C 7/22 | (2006.01) | |
| H04L 7/04 | (2006.01) | |
| G06F 1/12 | (2006.01) | |

(52) U.S. Cl.
CPC .............. *G06F 12/16* (2013.01); *G08B 5/222* (2013.01); *G11C 16/00* (2013.01); *G06F 1/12* (2013.01); *G06F 11/10* (2013.01); *G11C 7/222* (2013.01); *H04L 7/04* (2013.01)

(58) Field of Classification Search
CPC ........ G11C 7/22; G11C 7/222; G11C 7/1066; G11C 16/00; G06F 1/10; G06F 1/12; G06F 12/16; G06F 11/10; H04L 27/2656; H04L 27/2657; H04L 27/2662; H04L 27/2655; H04L 7/00; H04L 7/041; G08B 5/222
USPC ............................... 710/61, 30; 713/400, 401
See application file for complete search history.

(56) References Cited

U.S. PATENT DOCUMENTS

| | | | | |
|---|---|---|---|---|
| 5,230,084 A | * | 7/1993 | Nguyen | 340/7.34 |
| 5,726,639 A | * | 3/1998 | Romero et al. | 340/7.41 |
| 5,844,920 A | * | 12/1998 | Zook et al. | 714/769 |
| 6,118,833 A | * | 9/2000 | Bergmans et al. | 375/366 |
| 6,215,710 B1 | | 4/2001 | Han et al. | |
| 6,249,896 B1 | * | 6/2001 | Ho et al. | 714/814 |
| 6,442,644 B1 | | 8/2002 | Gustavson et al. | |
| 7,486,702 B1 | | 2/2009 | Yang | |
| 8,140,778 B1 | | 3/2012 | Hasan et al. | |
| 8,339,298 B1 | * | 12/2012 | Hagerty | 341/141 |
| 2003/0190922 A1 | * | 10/2003 | Dalvi et al. | 455/502 |
| 2004/0153936 A1 | * | 8/2004 | Smith et al. | 714/746 |
| 2005/0099833 A1 | * | 5/2005 | Perroni et al. | 365/63 |
| 2006/0007760 A1 | | 1/2006 | Schaefer | |

(Continued)

OTHER PUBLICATIONS

Fairchild, VIU operation & Maintenance Manual, 943-0M1001, NAS 5-27771, Sep. 11, 1990, pp. 29-50 and 199-204.*
U.S. Appl. No. 12/880,021, filed Sep. 10, 2010.
U.S. Appl. No. 12/879,992, filed Sep. 10, 2010.
U.S. Appl. No. 12/880,018, filed Sep. 10, 2010.

(Continued)

*Primary Examiner* — Hong Kim

(57) ABSTRACT

A memory device is provided. The memory device includes a preamble memory and a memory controller. The preamble memory is arranged to store a read preamble such that the read preamble includes a training pattern that is suitable for aligning a capture point for read data. Further, the training pattern is programmable such that the training pattern can be altered at least once subsequent to manufacture of the preamble memory. In response to a read command, the memory controller provides the read preamble stored in the preamble memory, as well as the read data.

18 Claims, 15 Drawing Sheets

| CLK | Rising Edge | Falling Edge | Rising Edge | Falling Edge | Rising Edge | Falling Edge | Rising Edge | Falling Edge |
|---|---|---|---|---|---|---|---|---|
| SIO0 | 1 | 1 | 0 | 0 | 0 | 1 | 1 | 0 |
| SIO1 | 1 | 1 | 0 | 1 | 1 | 0 | 0 | 1 |
| SIO2 | 1 | 1 | 0 | 0 | 0 | 1 | 1 | 0 |
| SIO3 | 1 | 1 | 0 | 1 | 1 | 0 | 0 | 1 |

(56) References Cited

U.S. PATENT DOCUMENTS

| | | | |
|---|---|---|---|
| 2006/0242308 A1* | 10/2006 | Carter et al. | 709/229 |
| 2007/0239918 A1 | 10/2007 | Hasan et al. | |
| 2008/0147897 A1 | 6/2008 | Talbot | |
| 2008/0165910 A1* | 7/2008 | Shi et al. | 375/365 |
| 2008/0226006 A1 | 9/2008 | Kondo | |
| 2009/0007760 A1* | 1/2009 | Herrick | 84/478 |
| 2009/0034344 A1 | 2/2009 | Nguyen et al. | |
| 2009/0137318 A1 | 5/2009 | Russo et al. | |
| 2009/0240357 A1 | 9/2009 | Kuo et al. | |
| 2010/0091591 A1 | 4/2010 | Byun | |
| 2010/0220828 A1 | 9/2010 | Fuller et al. | |
| 2010/0228891 A1 | 9/2010 | Talbot | |
| 2010/0257324 A1 | 10/2010 | Osawa et al. | |
| 2010/0268906 A1* | 10/2010 | Gillingham et al. | 711/167 |
| 2010/0275037 A1 | 10/2010 | Lee et al. | |
| 2011/0153915 A1 | 6/2011 | Zitlaw | |

OTHER PUBLICATIONS

Micron Technology In., Mobile Low-Power DDR SDRAM:, 512Mb: x16 x32 Mobile LPDDR SDRAM, Rev. Dec. 2009, pp. 1-98.

Official Communication for U.S. Appl. No. 12/879,992 mailed Jul. 19, 2012.

Official Communication for U.S. Appl. No. 12/879,992 mailed Dec. 31, 2012.

Official Communication for U.S. Appl. No. 12/880,018 mailed Nov. 15, 2012.

Official Communication for U.S. Appl. No. 12/880,021 mailed Jun. 19, 2012.

Official Communication for U.S. Appl. No. 12/880,021 mailed Nov. 8, 2012.

Official Communication for U.S. Appl. No. 12/880,021 mailed Jan. 16, 2013.

* cited by examiner

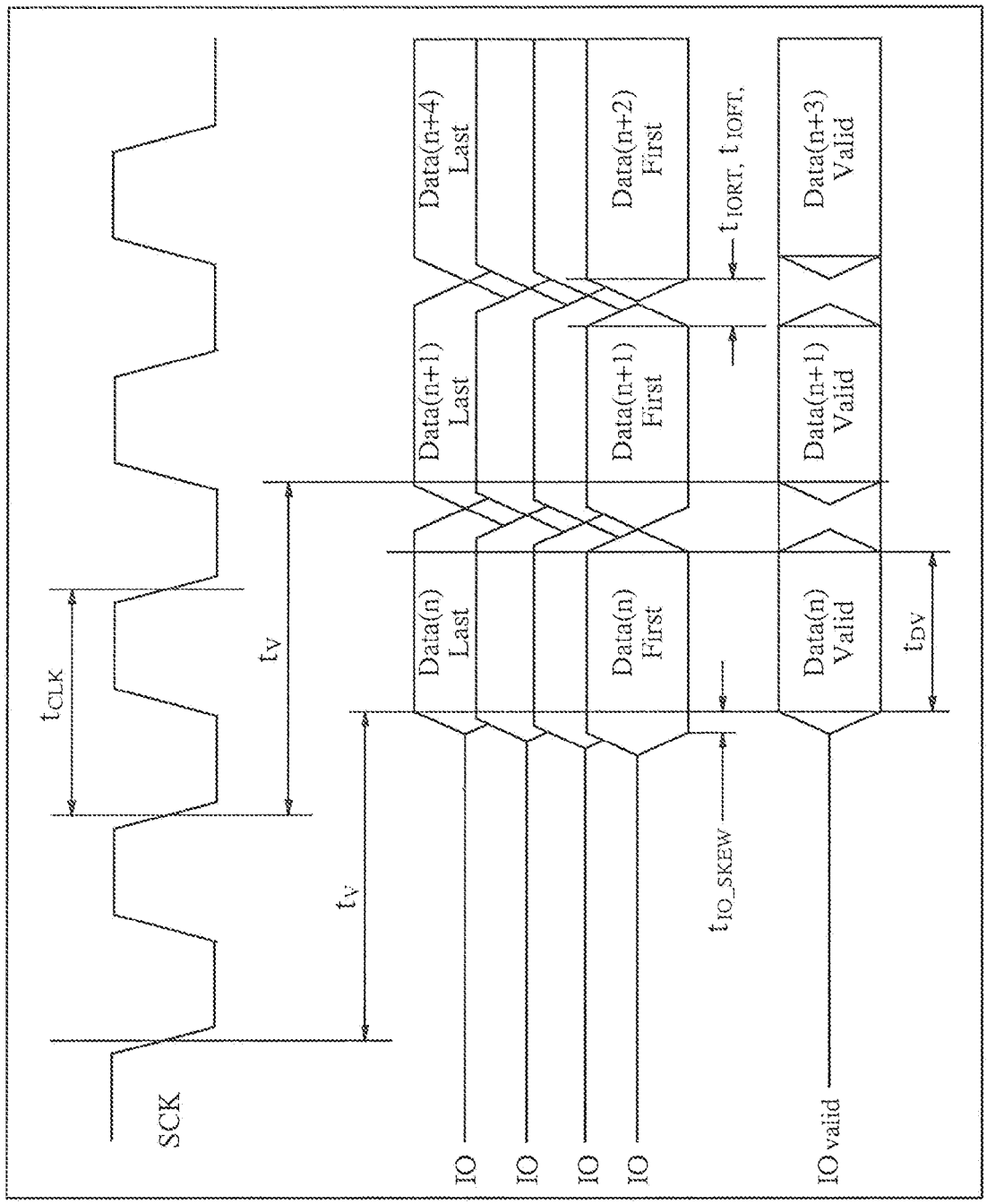

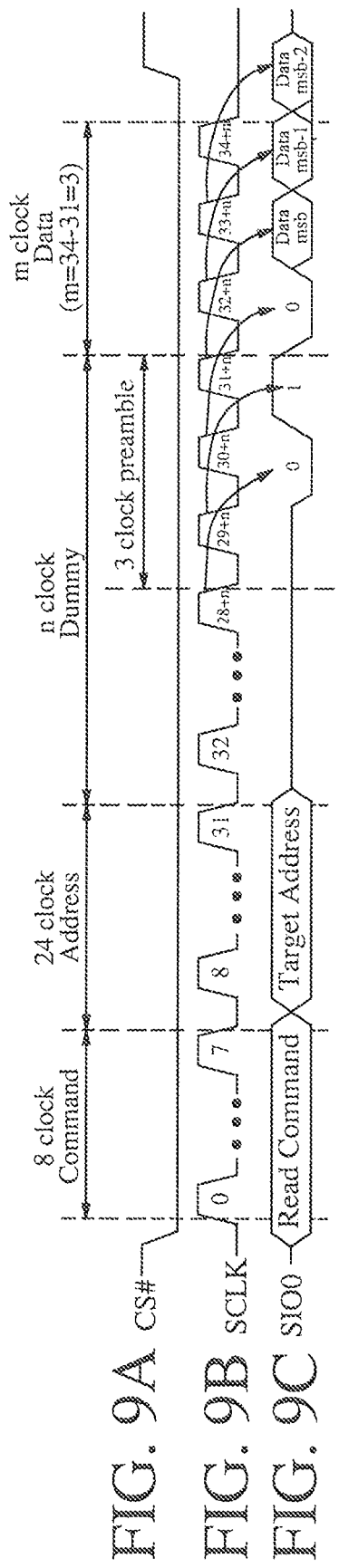

FIG. 10A clk_r0
FIG. 10B SIO0
FIG. 10C SIO1
FIG. 10D SIO2
FIG. 10E SIO3
FIG. 10F lock

| CLK | Rising Edge | Falling Edge | Rising Edge | Falling Edge | Rising Edge | Falling Edge | Rising Edge | Falling Edge |
|---|---|---|---|---|---|---|---|---|
| SIO0 | 1 | 1 | 0 | 0 | 0 | 1 | 1 | 0 |
| SIO1 | 1 | 1 | 0 | 1 | 1 | 0 | 0 | 1 |
| SIO2 | 1 | 1 | 0 | 0 | 0 | 1 | 1 | 0 |
| SIO3 | 1 | 1 | 0 | 1 | 1 | 0 | 0 | 1 |

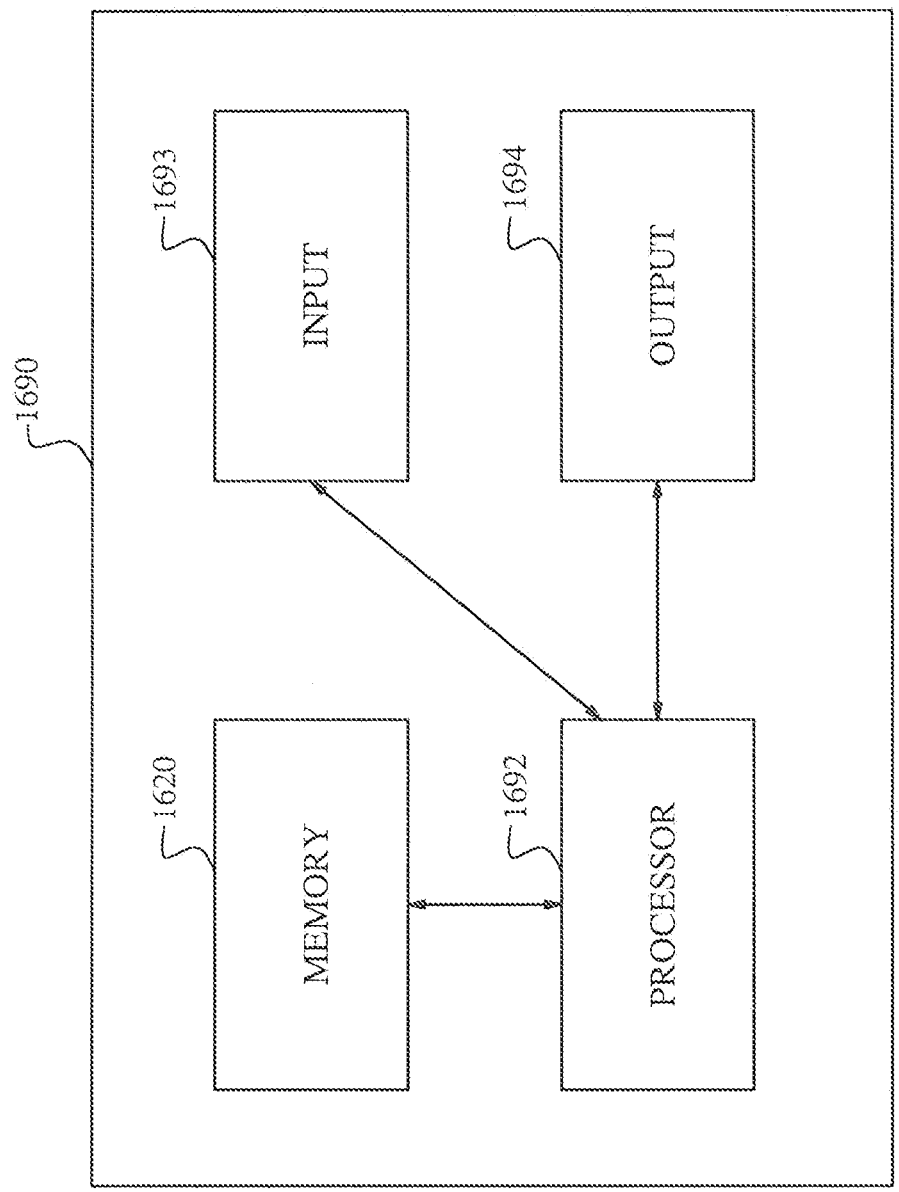

US 9,223,726 B2

APPARATUS AND METHOD FOR PROGRAMMABLE READ PREAMBLE WITH TRAINING PATTERN

TECHNICAL FIELD

The invention is related to computer-readable memory, and in particular, but not exclusively, to an apparatus and method for a programmable read preamble.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash.

BRIEF DESCRIPTION OF THE DRAWINGS

Non-limiting and non-exhaustive embodiments of the present invention are described with reference to the following drawings, in which:

FIGS. 8A-F illustrate a timing diagram for signals for an embodiment of the system of FIG. 6;

FIGS. 9A-C show a timing diagram for signals for an embodiment of the system of FIG. 6 where a data line includes a read preamble;

FIGS. 10A-G illustrate a timing diagram of embodiments of signals for an embodiment of system of FIG. 6 and a table of the training patterns employed by embodiments of the training signals illustrated in the timing diagram;

FIG. 16 illustrates a block diagram of an embodiment of a system that includes the memory device of FIG. 2, 3, 6, 14, or 15, in accordance with aspects of the invention.

DETAILED DESCRIPTION

Figure 1:
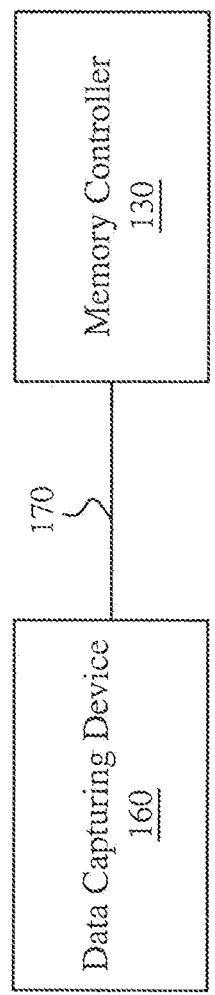
FIG. 1 illustrates a block diagram of an embodiment of a system.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a memory device that includes a preamble memory and a memory controller. The preamble memory is arranged to store a read preamble such that the read preamble includes a training pattern that is suitable for aligning a capture point for read data. Further, the training pattern is programmable such that the training pattern can be altered at least once subsequent to manufacture of the preamble memory. In response to a read command, the memory controller provides the read preamble stored in the preamble memory, as well as the read data.

FIG. 1 illustrates a block diagram of an embodiment of system 100. System 100 includes data capturing device 160 and memory controller 130.

In operation, data capturing device 160 provides a read command to memory controller 130. Memory controller 130 is configured to provide a response to the read command to one or more busses 170. The response to the burst read command includes read data. The response to the read command includes a read preamble. The read preamble includes a programmable data training pattern.

Data capturing device 160 is further configured to receive the response to the read command on bus(ses) 170. Additionally, data capturing device 160 is configured to employ the read preamble and an expected training pattern to align a capture point of the memory controller data with the memory system data.

Figure 2:
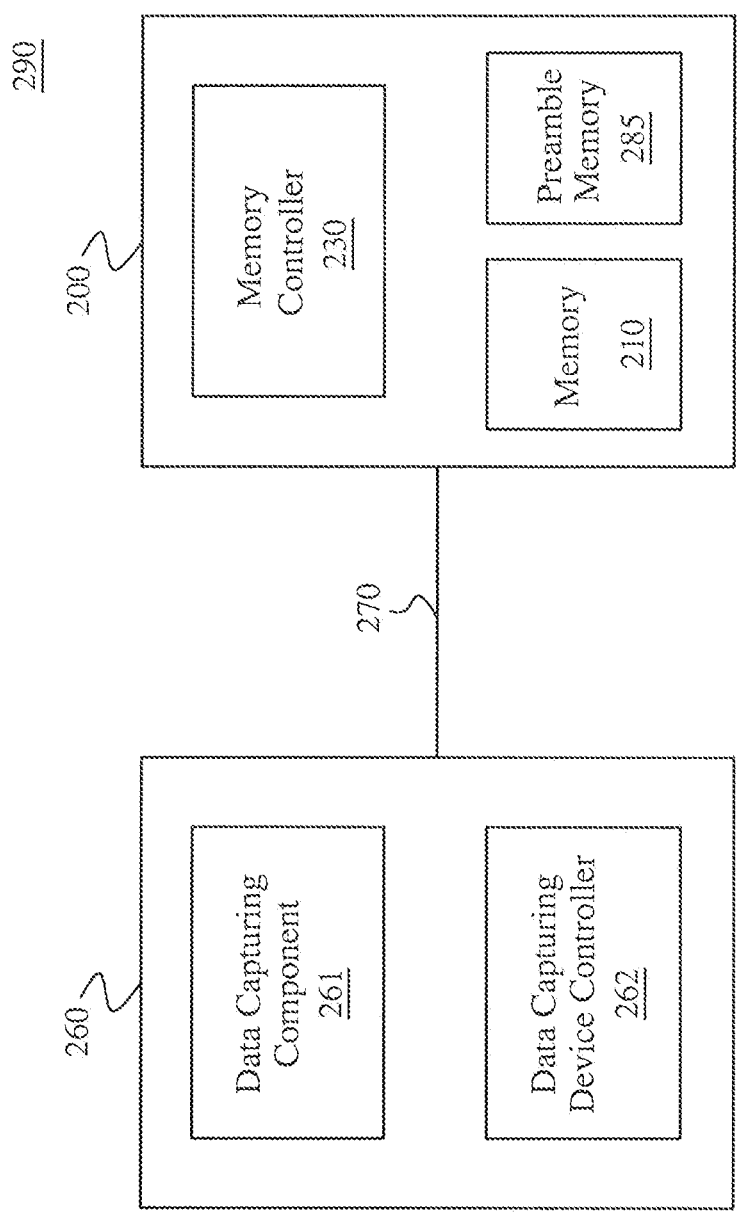
FIG. 2 shows a block diagram of an embodiment of the system of FIG. 1.

FIG. 2 shows a block diagram of an embodiment of system 290, which may be employed as an embodiment of system 190 of FIG. 1. System 190 includes data capturing device 260 and memory device 200. Memory device 200 includes memory controller 230, memory 210, and preamble memory 285. Data capturing device 260 includes data capturing component 261 and data capturing device controller 262.

Memory 200 may be any suitable type of memory. In some embodiments, memory 200 is flash memory, such as NOR flash, NAND flash, and/or the like. However, the invention is not so limited, and in other embodiments memory 210 may be ROM, RAM (random access memory), such as DRAM (dynamic RAM), or the like. The read preamble may be used for virtually any suitable type of volatile or non-volatile memory, such RAM or the like, as well as suitable peripheral devices.

Data capturing device controller 262 is configured to provide a read command, where the read command includes a target address. Memory controller 230 is configured to, in response to the read command that includes a target address, provide, to bus(ses) 270, memory system data stored in memory 200 at the target address. Preamble memory 285 is arranged to store a read preamble such that the read preamble includes a training pattern that is suitable for aligning a capture point for read data. Further, the training pattern is programmable such that the training pattern can be altered at least once subsequent to manufacture of preamble memory 285. Memory controller 230 is also configured to provide the preamble stored in preamble memory 285 on bus(ses) 270.

Data capturing device controller 262 is further configured to receive, on bus(ses) 270, the response to the read command from the memory system, including the programmable read preamble and the memory system data. Data capturing device controller 262 is further configured to employ the preamble and an expected training pattern to control data capturing component 261 to align a capture point of the memory system data with the memory system data.

The use of a training pattern to identify an optimal read data capture point is well suited for serial memory interfaces, but the invention is not so limited, and other types of interfaces may be employed within the scope and spirit of the invention.

Figure 3:
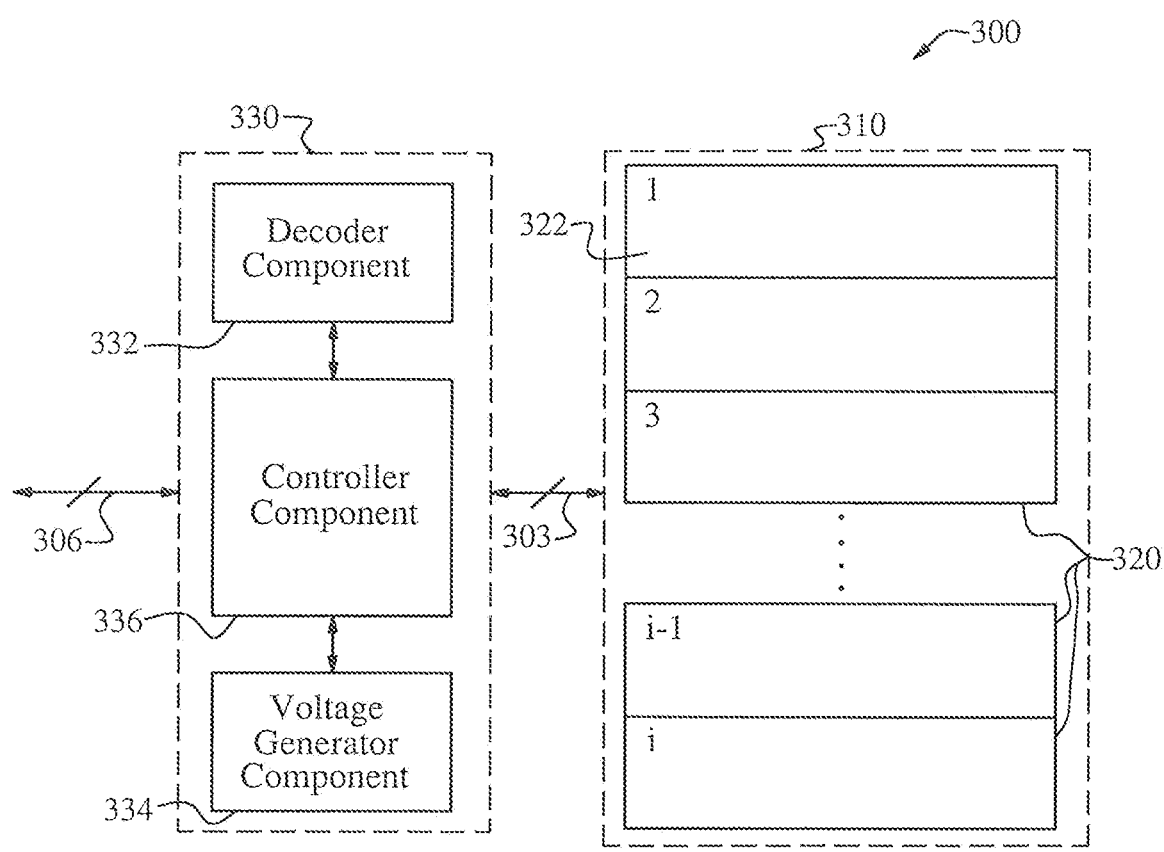
FIG. 3 illustrates a block diagram of the memory device of FIG. 2.

FIG. 3 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention described in the context of a NOR flash memory, the fabrication described herein may be employed in manufacturing other types of microelectronic memories or devices such as other various types of flash memory including NAND flash memory.

As shown, memory device 300 includes arrayed memory 310 and memory controller 330. Memory device 300 may be employed as an embodiment of memory device 200 of FIG. 2. Memory controller 330 is arranged to communicate addressing data, program data, and the programmable read preamble over signal path 306. Signal path 306 is an embodiment of bus(ses) 270 of FIG. 2. For example, signal path 306 can provide 8, 16, or more I/O lines of data. Memory controller 330 is also configured to access arrayed memory 310 over signal path 303. For example, memory controller 330 can read, write, erase, and perform other operations at portions of arrayed memory 310 via signal path 303. In addition, although shown as single lines, signal path 303 and/or signal path 306 may be distributed across a plurality of signal lines and/or bus lines.

Arrayed memory 310 includes memory sectors 320 (identified individually as sectors 1-i) that can be accessed via memory controller 330. Memory sectors 320 can include, for example, 256, 512, 1024, 2048 or more sectors having memory cells that can be individually or collectively accessed. In other examples, the number and/or arrangement of memory sectors can be different. In one embodiment, for example, sectors 320 can be referred to more generally as memory blocks and/or can be configured to have a configuration that is different than a bit line, word line, and/or sector topology.

Memory controller 330 includes decoder component 332, voltage generator component 334, and controller component 336.

Decoder component 332 is arranged to receive memory addresses via addressing signal path 306 and to select individual sectors, arrays, or cells according to the architecture of arrayed memory 310.

Decoder component 332 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 310 and another portion (or another grouping of bits) can identify a core cell array within a particular sector.

Voltage generator component 334 is arranged to receive one or more supply voltages (not shown) and to provide a variety of reference voltages required for reading, writing, erasing, pre-programming, soft programming, and/or under-erase verifying operations. For example, voltage generator component 334 can include one or more cascode circuits, amplifier circuits, regulator circuits, and/or switch circuits that can be controlled by controller component 336.

Controller component 336 is arranged to coordinate reading, writing, erasing, and other operations of memory device 300. In one embodiment, controller component 336 is arranged to receive and transmit data from an upstream system controller (for example, data capturing device 260 of FIG. 2). Such a system controller can include, for example, a processor and a static random access memory (SRAM) that can be loaded with executable processor instructions for communicating over signal path 306. In another embodiment, controller component 336 as well as other portions of memory controller 330 may be embedded or otherwise incorporated into a system controller or a portion of a system controller.

Embodiments of controller component 336 can include a state machine and/or comparator circuits. State machine and comparator circuits can include any of a variety of circuits for invoking any of a myriad of algorithms for performing reading, writing, erasing, or other operations of memory device 300. State machines and comparator circuits can also include, for example, comparators, amplifier circuits, sense amplifiers, combinational logic, or the like.

In some embodiments, memory device 300 is a flash-based memory including flash-based memory cells, such as flash-based NOR cells, NAND cells, or hybrids of the two. In some embodiments, memory device 300 is a MirrorBit™ flash memory. However, the invention is not so limited, and memory device 300 may include any suitable type of volatile or non-volatile memory, such RAM or the like, as well as suitable peripheral devices. Further, memory devices discussed above may be simpler or more complex than those discussed above. For example, although embodiments having 8 or more I/O lines and having 256 or more sectors were discussed above, some embodiments may be much simpler such as having, for example, only one I/O line and/or only one sector.

Figure 4:
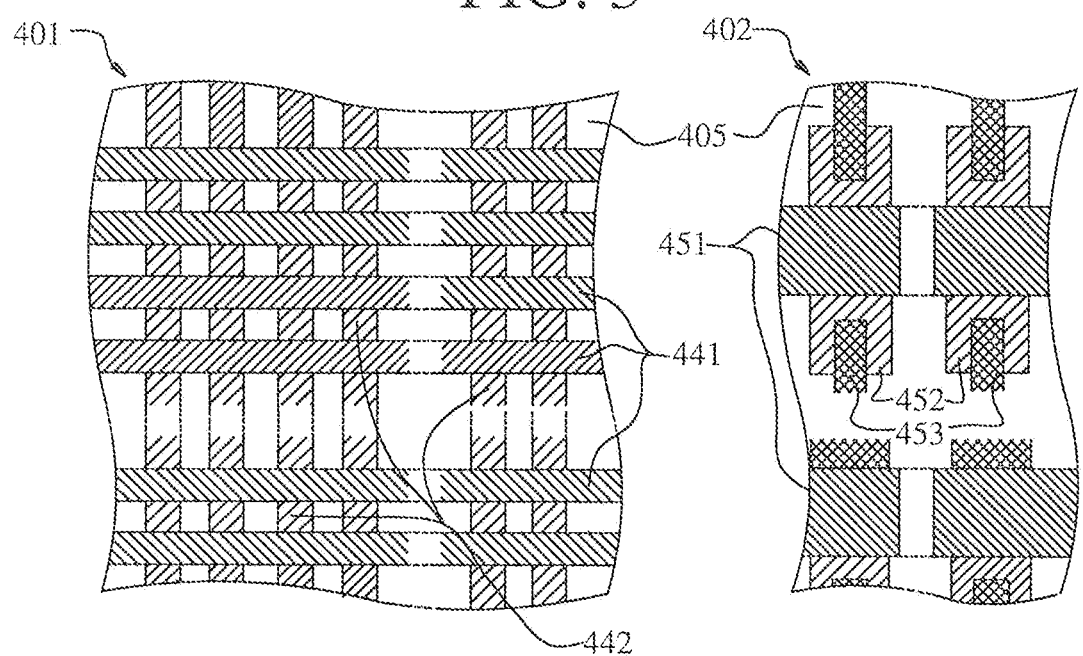
FIG. 4 illustrates a partial top plan view of an embodiment of core and peripheral sections of a memory that may be employed in the memory of FIG. 3.

FIG. 4 shows a partial top plan view of separate sections of a memory. Core section 401, for example, may be an embodiment of a portion of sector 320 of FIG. 3 and may include arrayed core memory cells. Peripheral section 402, for example, may be an embodiment of memory controller 310 of FIG. 3 or a portion of memory controller 310 of FIG. 3.

Core section 401 includes core polysilicon lines 441, conductive regions 442, and a portion of substrate 405. Portions of core polysilicon lines 441 are coupled to the gates of individual memory cells (not shown in FIG. 4) and can be configured as a word line, a source select gate line, and/or a drain select gate line. Portions of conductive regions 442 can include, for example, p-type and/or n-type doped regions of substrate 405 for forming source/drain regions and/or conductive lines. For example, conductive regions 442 can form portions of bit lines and/or other signal lines. Also, in some embodiments, individual conductive regions 442 extend at least partially underneath individual core polysilicon lines 441.

In one embodiment, core section 401 is arranged in a NOR topology, and individual memory cells can be individually accessed via individual conductive regions 442. In another embodiment, core section 401 is arranged in a NAND topology, and individual memory cells can be accessed though individual conductive regions 442 collectively but not individually. In other embodiments, hybrid architectures can be employed. For example, core section 401 can be configured to have a portion that is NAND-based and another portion that is NOR-based. Also, although not shown if FIG. 4, core section 401 may include any of a variety of interconnect and/or passivation layers, such as dielectric, conductive, or other layers. For example, conductive regions 442 can be positioned beneath a dielectric spacer layer.

Peripheral section 402 includes peripheral polysilicon lines 451, conductive regions 452, and interconnects 453. Portions of peripheral polysilicon lines 451 are coupled to individual peripheral devices (not shown in FIG. 4).

Portions of conductive regions 452 can include, for example, p-type and/or n-type doped regions of substrate 405 for forming conductive features, such as a source, a drain, or other type of well. Interconnects 453 can include conductive lines that electrically intercouple portions of peripheral section 402 and/or electrically couple core section 401 with peripheral section 402. For example, interconnects 453 can include a combination of metal lines and vias. Also, although not shown FIG. 4, peripheral section 402 may also include any of a variety of other interconnect and/or passivation layers.

Figure 5:
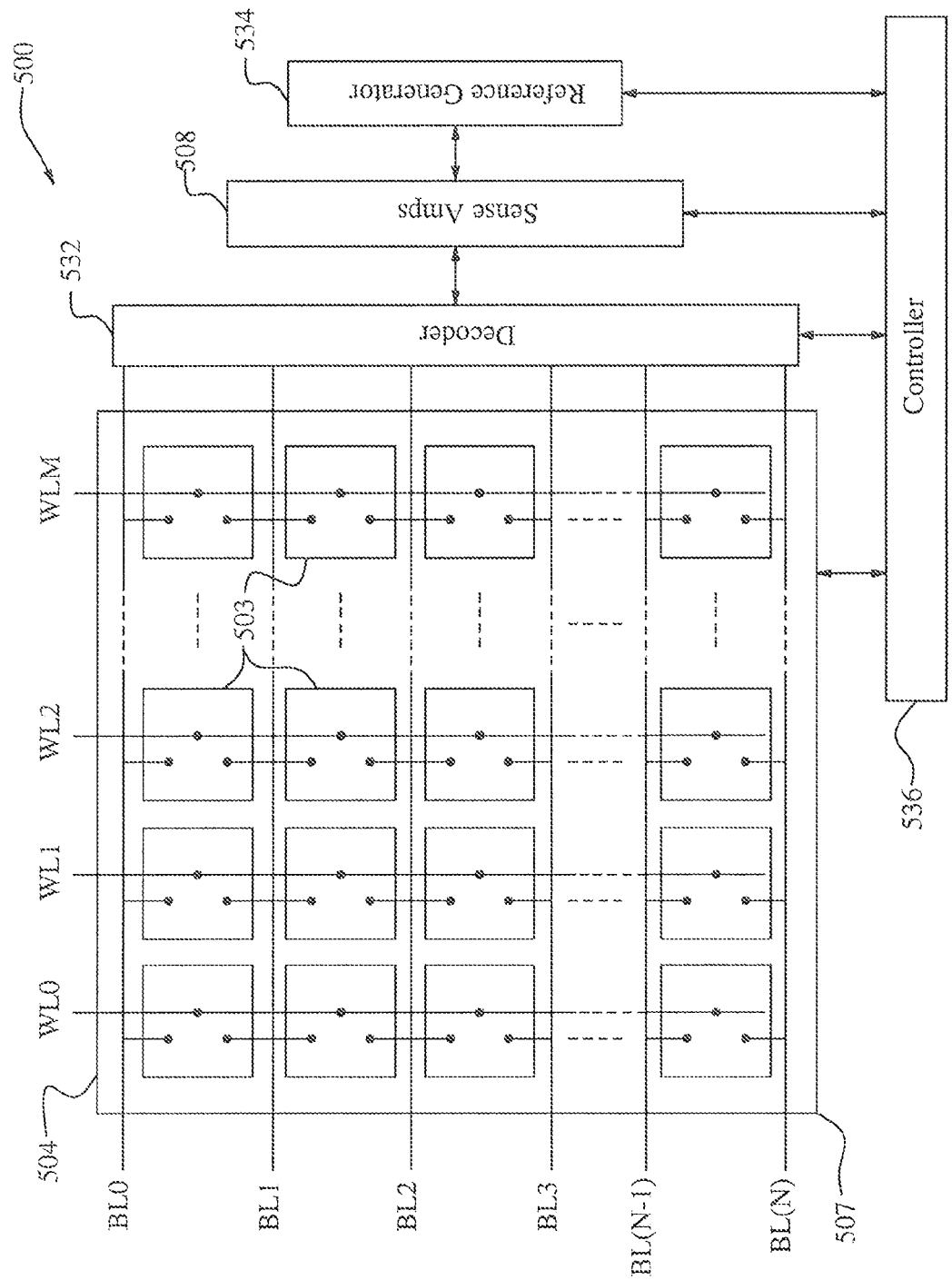
FIG. 5 shows a block diagram of an embodiment of the memory device of FIG. 3.

FIG. 5 shows an embodiment of memory device 500, which may be employed as an embodiment of memory device 300 of FIG. 3. Not all the components may be required to practice the invention, and variations in the arrangement and type of the components may be made without departing from the spirit or scope of the invention. As shown, memory device 500 of FIG. 5 includes memory array 507 and individual memory devices 503 located within memory array 507. In some embodiments, individual memory devices 503 are multi-cell memory devices or the like. Memory devices 503 are arranged in N+1 rows and M+1 columns in memory array 507. In one embodiment, each row of memory array 507 is accessed by two of the bit lines BL0 to BLN. Each column of memory array 507 is accessed by one of word lines WL0 to WLM. Accordingly, each of memory devices 503 can be accessed by activating the corresponding bit lines and a corresponding word line of the cell. In one embodiment, each column of memory array 507 defines a data word. If N+1 has a value of 8, for example, the cells in each column of memory array 507 define a byte of data.

Memory device 500 can also include reference generator 534, sense amps 508, decoder 532, and memory controller 536. Reference generator 534 is configured to provide a reference signal (e.g., a reference voltage or a reference current). Sense amps 508 are configured to provide read data by comparing the reference signal to sensed signals from individual memory cells 503. For example, when word line WL0 is activated, sense amps 508 can provide read data corresponding to each of the memory cells in column 504 or a portion of the memory cells in column 504. Sense amps 508 are also configured to write individual memory devices 503. For example, sense amps 508 can provide separate write signals to each of the memory cells in column 504 or a portion of the memory cells in column 504 to write a logic state to these memory cells.

Decoder 532 is configured to selectively couple individual sense amps 508 to individual memory devices 503 for reading and/or writing. In one embodiment, decoder 532 includes a sector decoder. As such, decoder 532 may be arranged to selectively couple individual sense amps 508 to a particular column or grouping of columns within memory device 500. For example, a grouping of columns may define a sector, and another grouping of columns may define another sector. In another embodiment, memory device 500 may include an array decoder for selectively coupling sense amps 508 to memory array 504 or another array of memory device 500 (not shown). For example, decoder 532 may form a portion of such an array decoder. In addition, embodiments of array decoders can be configured to work separately or in conjunction with a sector decoder.

Memory controller 536 is configured to drive the various components of the memory device 500, including reference generator 534, sense amps 508, and decoder 532. Memory controller 536 is also configured to activate and de-activate individual word lines WL0 to WLM for reading and/or writing to memory array 507. For example, memory controller 536 can provide a select signal to one of the columns WL1 to WLM to activate that column. Further, memory controller 536 can provide a select signal to decoder 532 for selecting particular rows BL0 to BLN (or sector) to be written to or read from.

In general, embodiments of memory device 500 can be configured differently. For example, components may be added to or omitted from memory device 500 and/or components may be combined in memory device 500. In one embodiment, word lines WL0 to WLM may be arranged in rows (instead of columns), and bit lines BL0 to BLN may be arranged in columns (instead of rows). Further, other arrangements of bit lines and word lines are possible. Embodiments of memory devices 503 can be configured to receive any of a wide variety of current and/or voltage signals for reading and/or writing to individual memory cells. In one embodiment, a memory cell can receive a specific level of current or voltage for reading and/or writing to the memory cell. In another embodiment, a memory cell can receive a combination of current and voltage signals for reading and/or writing the memory cell.

Memory cells 503 may be flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layers. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0" value). There also exist multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As one example, a dual cell device may also be a MLC device that stores four-bits-per-cell so that one transistor equates to 16 different states. This enables greater capacity, smaller die sizes and lower costs for the flash devices.

Figure 6:
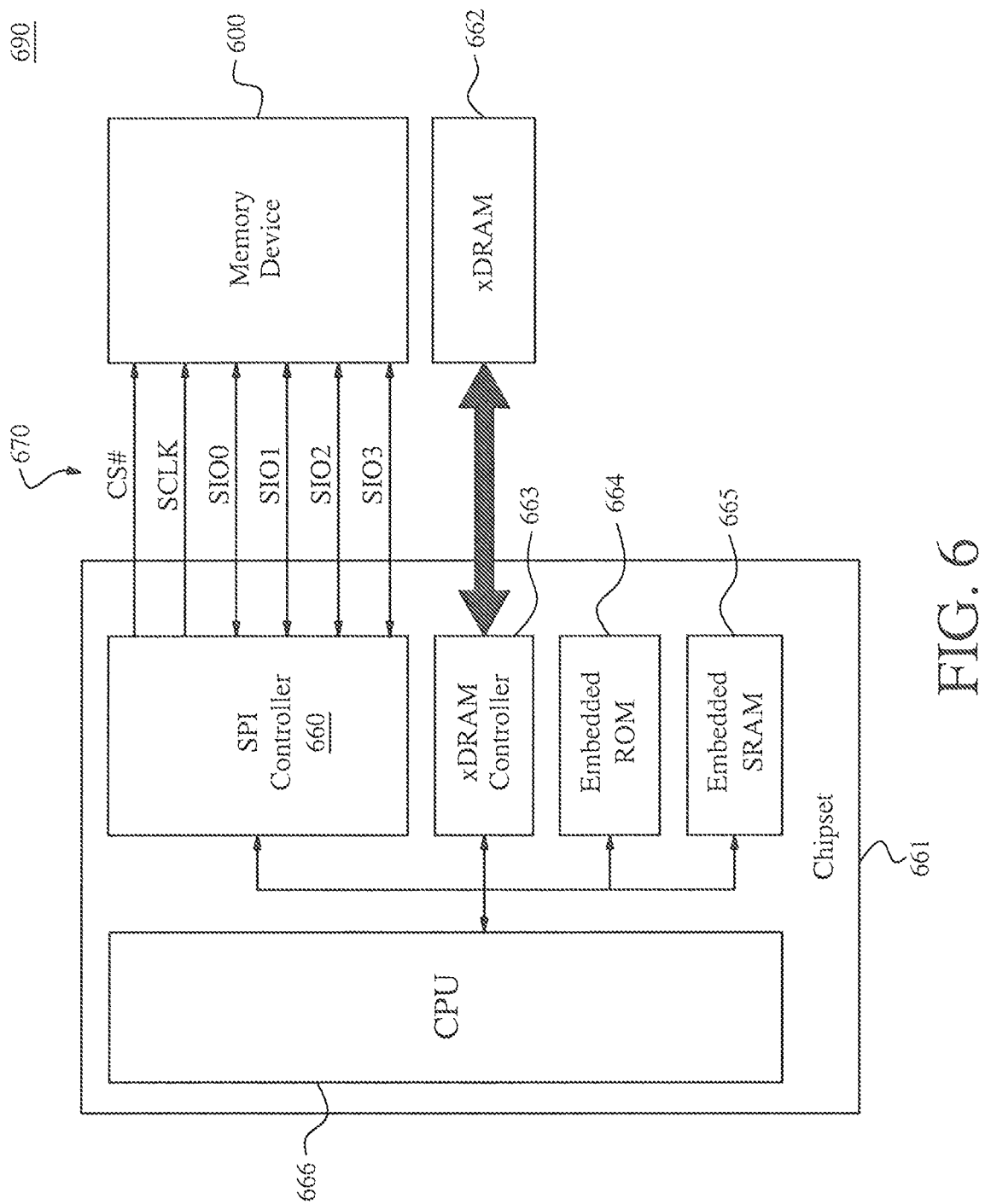
FIG. 6 illustrates an embodiment of the system of FIG. 2.

FIG. 6 illustrates a block diagram of an embodiment of system 690, which may be employed as an embodiment of system 290 of FIG. 2. System 690 includes memory device 600, xDRAM 662, and chipset 661. Chipset 661 includes xDRAM controller 663, embedded ROM 664, embedded SRAM 665, and central processing unit (CPU) 666.

In some embodiments, system 690 is an embedded system that uses the Serial Peripheral Interface (SPI) protocol to communicate between chipset 661 and memory device 600. Memory inside chipset 661, such as embedded ROM 664 and/or embedded SRAM 665, may be used to store computer readable instructions, data structures, program modules, or other data. Additional external stored data may be accessed from memory device 600 and/or xDRAM 662 (e.g., synchronous DRAM (SDRAM), or the like). Chipset 661 is arranged to employ xDRAM controller 663 to communicate with xDRAM 662. Chipset 661 is arranged to employ SPI controller 660 to communicate with memory device 660 via the SPI protocol via SPI bus 670. SPI controller 660 is a host controller. In some embodiments, SPI bus 670 uses four bits of data Serial Input/Output 0 through Serial Input/Output 3 (SIO0-SIO3) with six active signals, with the other two signals being chip select (CS#) and serial clock SCLK. Each data line SIO0-SIO3 is a bi-directional single-bit serial data line. By employing four separate data lines, four serial data lines are provided in parallel. The SPI bus has a relatively low pin count (as low as four active signals) and can achieve relatively high clock rates (e.g., in excess of 100 MHz). A particular device on the bus, such as memory device 600, may be enabled by asserting signal CS#, which is asserted low in some embodiments. Serial clock SCLK is a reference clock signal that is used to clock data transferred in either direction on the SIO bus (SIO0-SIO3).

In order for SPI controller 660 to use the training pattern to determine the optimal capture point of the data, SPI controller 660 stores the expected value of the training pattern to compare against the received training pattern. In some embodiments, SPI controller 660 stores the expected training pattern when manufactured. In these embodiments, memory device 600 provides a training pattern specifically designed for use with the training pattern expected by SPI controller 660. In other embodiments, the training pattern is communicated from memory device 600 to SPI controller 660 prior to any read commands, such as during the boot process of chipset 661. In some embodiments memory device 600 can change the training pattern, and communicate the updated training pattern to 660, or the training pattern may be specified by SPI controller 660 and communicated to memory device 600, which changes the training pattern to the one specified by SPI controller 660.

In some embodiments, each bit line, such as each bit line SIO0, SIO1, SIO2, and SI03, has its own preamble, and SPI controller 660 determines the optimal capture point for each bit line separately and independently of the others. In some embodiments, each preamble is separately programmable. There is no data strobe used in system 600. System 600 employs a data capturing mechanism that does not use a data strobe.

Figures 7A, 7B, 7C:
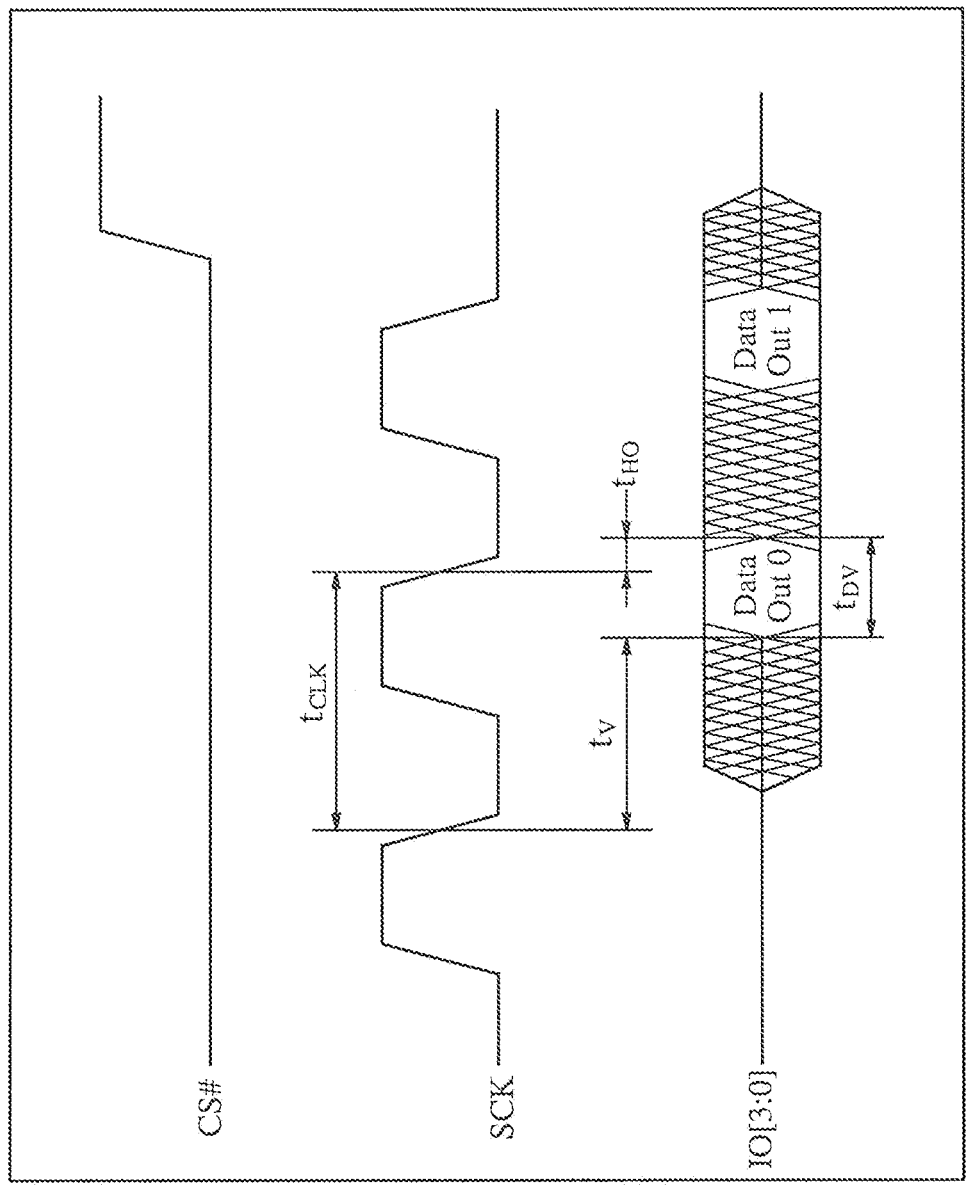
FIGS. 7A-C show a timing diagram of signals for an SPI protocol.

FIGS. 7A-7C show a timing diagram of signals for an example of an SPI protocol. FIG. 7A shows a waveform of chip select signal CS#. FIG. 7B shows a waveform of clock signal SCLK. FIG. 7C shows a waveform of a four bit data signal (appearing, e.g., on data lines SI0-SI3).

As new products have been developed, the clock period (tCLK) of clock signal SCLK has continued to get shorter while the clock to data valid time (tV) and data hold time (tHO) specifications have remained relatively constant. FIGS. 7A-C show the standard timing specification for an SPI Read operation. Shrinking tCLK values and relatively constant tV/tHO values present problems for successful data capture.

Under a previous approach, during read operations, new data is output by the memory device upon each low-going clock edge and latched by the host controller on the subsequent low going clock edge. This strategy works well as long as the clock to data valid time is somewhat shorter than the clock period. Once tV exceeds a full clock period (tCLK) the host controller cannot directly use the "next" falling clock edge to latch a new data value.

When this timing specification is used, the data valid period (tDV) can be calculated with the equation tDV=tCLK+tHO−tV. As clock frequencies increase and tCLK shrinks the period of time when data is valid will collapse altogether. The data valid period will disappear when tCLK becomes smaller than tV minus tHO (tCLK<tV−tHO). FIGS. 8A-F illustrate a timing diagram for signals for an embodiment of system 600 of FIG. 6. FIG. 8A illustrates a waveform of serial clock SCLK. FIGS. 8B-8E illustrate waveforms of four data lines. FIG. 8F illustrates data valid line tDV for the data.

The tHO spec is eliminated in this timing description and the data valid period is calculated with the following equation: DV=tCLK(min)−tIO_SKEW−tIORT. There are second order effects that further reduce the data valid time but the more significant factors include the minimum clock period (tCLK(min)), the skew between when the first IO data value appears (tIO_SKEW) and the last value appears and finally the IO transition time (rise/fall time, tIORT/tIOFT). In this equation, tV and tHO are not part of the data valid calculation. Elimination of tHO removes the "hard stop" that limits the upper frequency in the legacy calculation but the untethering of tDV from a specific clock edge removes the deterministic moment (falling clock edge) that was previous used to capture data.

FIGS. 9A-C show a timing diagram for signals for an embodiment of the system of 600 of FIG. 6 where a data line includes a programmable read preamble. FIG. 9A shows a waveform of chip select signal CS#. FIG. 9B shows a waveform of clock SCLK. FIG. 9C shows a waveform of data line SIO0.

The SPI host controller (e.g., SPI controller 660 of FIG. 6) drives the SIO bus during the 8 clock Command and 24 clock Address time periods. During this time, the SPI host controller issues a read command on the SIO bus, and then issues a target memory address on the SIO bus corresponding to the memory address which is to be read from. The SPI host controller stops driving the bus after the target address is provided on the bus. After n dummy clock cycles, the memory device (e.g., memory device 600 of FIG. 6) serially returns data from memory at the target address in response to the read command. As previously discussed, the memory device also inserts a programmable read preamble on the bus during the dummy clock cycles, just prior to driving the data from memory on the bus. The memory device starts driving the bus when it starts to provide the preamble to the bus.

The read protocol illustrates in FIGS. 9A-9C does not use the next falling clock edge to capture data. Instead, the host controller (e.g., SPI controller 660) is responsible for finding the optimal moment to sample the data. The host controller uses a training pattern in a read preamble to determine when valid data is presented on the bus and decide upon an acceptable moment for data capture within the data valid window. Knowing the optimal capture time allows for smaller data valid times and facilitates higher data throughputs.

The SPI host controller (e.g., SPI controller 660 of FIG. 6) specifies both the command and address during the initial portion of a read cycle and then waits for the memory device (e.g., memory device 600 of FIG. 6) to drive the read preamble onto the bus, as shown in FIG. 9C. At higher clock frequencies the initial read latency results in several unused clock cycles, referred to as dummy clock cycles, between when the command/address is specified and when data is driven onto the bus.

During this time, several dummy clock cycles occur in which no useful information is presented onto the SPI bus. During this gap in bus utilization prior to data arriving, a preamble is inserted that includes a data training pattern immediately prior to the target data being placed on the bus, as illustrated in FIG. 9C in one embodiment. The preamble asserts a known data pattern immediately prior to array data being driven onto the 10 bus (e.g., SIO0-SIO3 of FIG. 6). The preamble is used by the host controller (e.g., SPI controller 660 of FIG. 6) to determine the period of time valid data is available on the 10 bus. Once the host controller determines when data is valid, a skew time for data capture is selected to maximize read timing margin. This same skew offset is used for data capture during the remainder of the read operation.

The preamble allows the host controller to optimize the point of data capture prior to every read operation. It is expected that any variance in temperature and voltage during the read operation will be minimal and will not require a change to the data capture point. Between adjacent read operations it is expected that the data valid window may shift significantly and that recalibration may be required.

The preamble value shown in FIG. 6 is one example of a preamble pattern. However, other values may also be used as a preamble sequence, as discussed in greater detail below. The preamble is not required to be three clock cycles (as shown in FIG. 9C); rather, longer or shorter preambles (as well as different data patterns) may also be used in other embodiments. Further, the preamble value is programmable, as discussed in greater detail below.

In some embodiments, each training pattern begins with a 0 to 1 transition. In these embodiments, this first transition is a start bit that indicates that the training pattern is beginning. Since the beginning delay of the valid data time relative to clock signal SCLK is not known in advance, the start bit may be used to determine when to begin comparing the training pattern to the expected value.

In some embodiments, a read preamble may be used in a single data rate (SDR) environment. The addition of a read preamble may also be used in a double data rate (DDR) environment where tV exceeds half of tCLK.

Figure 10G:
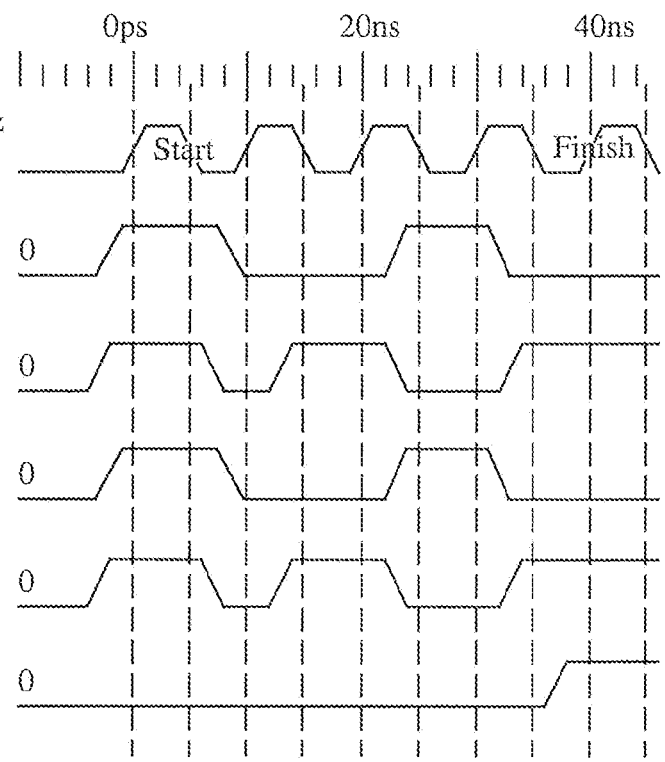

FIGS. 10A-G illustrates a timing diagram of embodiments of signals for an embodiment of system 600 of FIG. 6 while the training patterns are occurring on the data lines, and a table of the training patterns employed by embodiments of the training signals illustrated in the timing diagram. FIG. 10A illustrates a waveform of clock signal SCLK. FIGS. 10B-10E illustrate waveforms of data lines SIO0-SIO3 while the training patterns are occurring on the data lines. FIG. 10F illustrates a lock signal (used by the host controller, e.g. SPI controller 660 of FIG. 6) to lock the proper delayed version of the clock line for capturing the read data. After the lock signal is asserted (asserted high in the embodiment illustrated in FIG. 10F), the clock signal determined to be valid (after using the training pattern to determine the valid clock) is locked for reading the data. FIG. 10G illustrates the training pattern used in each data line according to one embodiment.

In some embodiments, data training is performed within a few cycles so that it is done before the initial access time of the memory device expires. On the other hand, better reliability may be achieved by having enough 0 to 1 and 1 to 0 transitions on the same bit lane and adjacent bit lanes so that all possible data transitions are covered. Accordingly, a data training pattern for use in the read preamble preferably has the following four properties:
1. 0 to 1 and 1 to 0 transition on same bit lanes.
2. 0 to 0 and 1 to 1 transition on same bit lanes.
3. 0 to 1 and 1 to 0 transition on adjacent bit lanes covering worst case cross talk scenario.
4. 1 to 0 and 0 to 1 transition on adjacent bit lanes covering worst case cross talk scenario.

Although it is preferable for the data training pattern to have the four properties discussed above, the invention is not so limited, and other training patterns may be employed, such as the simple 010 pattern discussed above. Further, the data training pattern is programmable, as discussed in greater detail below. The data pattern illustrated in FIGS. 10A-G illustrates one data training pattern having these four properties for four bits of serial data in four clock cycles.

Figure 11:
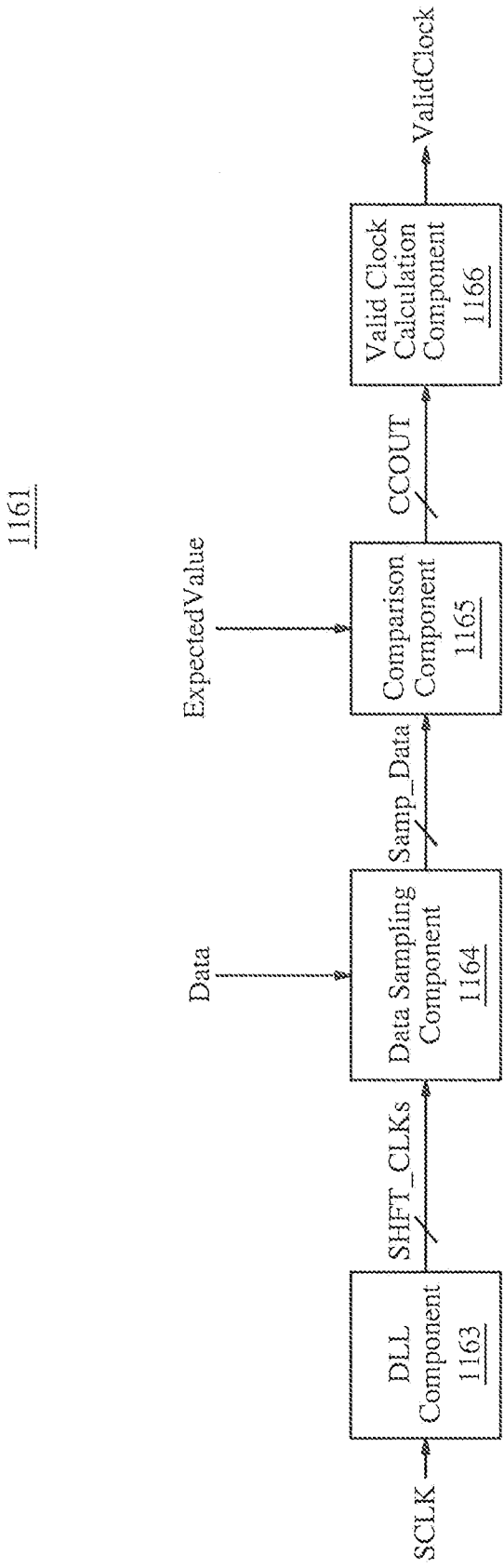
FIG. 11 shows a block diagram of an embodiment of the data capturing component of FIG. 2.

FIG. 11 shows a block diagram of an embodiment of data capturing component 1161, which may be employed as an embodiment of data capturing component 261 of FIG. 2. Data capturing component 1161 includes DLL component 1163, data sampling component 1164, comparison component 1165, and valid clock computation component 1166. DLL component 1163 is arranged to generate shifted clock signals SHFT_CLKs, where each of the shifted clock signals is a clock signal that is delayed relative to clock SCLK, and where the delay is different for each separate shifted clock.

Data sampling component 1164 is configured to sample data received from the memory device (e.g., memory device 200 of FIG. 2) with each of the shifted clock signals SHFT_CLKs to provide sampled data Samp_Data. Sampled data Samp_Data includes a separate data line for each different shifted clock signal SHFT_CLKs, since the data is sampled by each shifted clock signal SHFT_CLKs. Comparison component 1165 is configured to compare each of the sampled data lines Samp_Data to the expected value for the preamble pattern ExpectedValue, to provide comparison component output signal CCOUT. Valid clock calculation component 1166 is configured to employ signal CCOUT in order to determine, after a preamble is received from the memory device, which of the shifted clock signals SHFT_CLKs most accurately samples the data at a valid time, and to output signal ValidClock indicating the clock that was determined as most accurately sampling the data at a valid time. Once the valid clock is determined, the data capturing device controller (e.g., 262 of FIG. 2) locks the valid clock line for capturing subsequent data coming from the memory device for the remainder of the read operation. The valid clock calculation can be accomplished in different ways in different embodiments. One example of such a calculation for a specific embodiment is discussed in greater detail below.

In order to achieve reliable data capturing, some embodiments of data capturing component 1161 may ensure that each and every bit of training pattern is captured properly to ensure that actual data will be captured with highest reliability. Since there is a possibility of dynamic shifting of the data valid window on same data IO line, in some embodiments, data capturing component 1161 samples at least 3 valid clock lines and selects the middle clock line (from among the valid clock lines) as the final data capturing clock.

The various components in data capturing component 1161 may be implemented in different ways in different embodiments. For example, in some embodiments, one or more of the components may be implemented in hardware, firmware, software embodied on processor-readable medium, and/or some combination of the above. Hardware implementations may be implemented in analog, digital, some combination or analog and digital, and/or the like. In some embodiments, data capturing component 1161 is implemented by a field-programmable gate array (FPGA).

Figure 12:
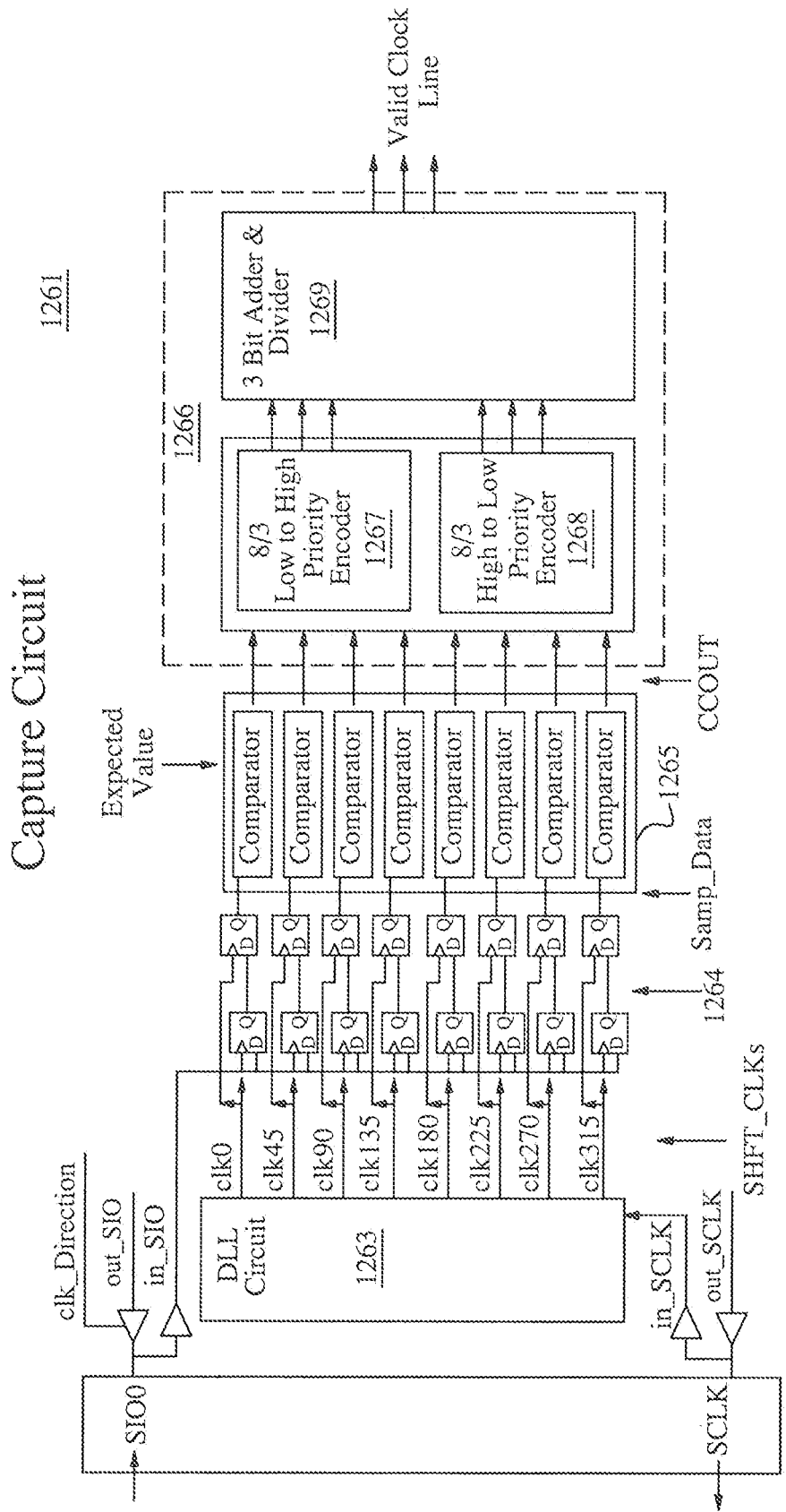
FIG. 12 illustrates a block diagram of an embodiment of the data capturing component of FIG. 11.

FIG. 12 illustrates a block diagram of an embodiment of data capturing component 1261, which may be employed as an embodiment of data capturing component 1161 of FIG. 11. In the embodiments shown, eight shifted clocks are employed (including clock SCLK itself). In other embodiments, more or less than eight shifted clocks may be employed.

In FIG. 12, the capture circuit is shown for one IO line. For each IO line and for positive edge and negative edge triggered data capture, the same circuit illustrated in FIG. 12 may be reused as needed. The number of sampling clock requirement depends on the clock frequency, setup and hold time of the data capturing flops and clock jitter of the phase shifted clocks.

DLL circuit 1263 may be employed as an embodiment of DLL component 1163 of FIG. 11. DLL circuit 1263 is configured to generate eight shifted clocks SHFT CLKs using clock signal SCLK as a reference. After receiving the start bit on SRN, data capturing component 1261 starts to receive the training pattern.

Data sampling component 1264 includes two stages of eight flip-flops each. Comparison component 1265 includes eight comparators. Valid clock calculation component 1266 includes 8/3 low-to-high priority encoder 1267, 8/3 high-to-low priority encoder 1268, and 3-bit adder/divider 1269. Shifted clock signals SHFT CLKs include clk0, clk45, clk90, clk135, clk180, clk225, clk270, and clk315. Each clock is shifted by 45 degrees from the previous clock, with a delay of one eighth of the clock period. For example, clk0 is simply SCLK, clk45 is a clock signal that is identical to signal SCLK except that is delayed by one-eighth of the clock period, clk90 is identical to signal SCLK except that is delayed by one-fourth of the clock period relative to SCLK, clk135 is identical to signal SCLK except that is delayed by three-eighths of the clock period relative to SCLK, and so forth. In some embodiments, DLL circuit 1163 is implemented in an FPGA and the eight shifted clocks are generated using a digital clock manager (DCM) of the FPGA.

The pattern is first captured in eight flip-flops in data sampling component 1164 clocked by the eight shifted clocks SHFT_CLKs. In the embodiment illustrated, the pattern is further passed through another stage of eight flip-flops to minimize metastability. However, the second stage of flip-flops is optional and is not included in some embodiments of data sampling component 1264. The output of each flip flop in the second stage is fed to a separate comparator in comparison component 1265, and the training pattern is compared with expected value which is already known to SPI controller 660. The eight outputs from the comparison stage 1265 are driven to a priority encoder stage. In the priority encoder stage there is low to high and high to low priority encoding. This provides the range of valid clock lines. Each of the valid clock lines is fed to adder/divider circuit 1269, which calculates the middle clock line from the range of valid clock lines. The host controller (e.g., SPI controller 660 of FIG. 6) then locks the valid clock line for capturing subsequent data coming from the memory device (e.g., memory device 600 of FIG. 6).

Although not shown in FIG. 12, in some embodiments, an additional state machine may be included in valid clock calculation component 1266 between comparison stage 1265 and the priority encoder stage. In these embodiments, the state machine is configured to ensure that the inputs to the priority encoder stage are zero (fail) if the comparison fails at any time during the training pattern (from the time of the start bit, indicating the training pattern has started, to the end of the training pattern). This way, the only shifted clock signals SHFT_CLKs that pass are the ones that match the expected value throughout the entire training pattern. The priority encoder stage and the adder & divider stage operate to select the middle of the passing stages as the valid clock line. If for some reason all of the shifted clock signals fail, and error message is sent.

In some embodiments, each sampled training pattern is compared with the expected training pattern on every positive clock edge. In some embodiments, each of the training bits is captured in parallel and at every positive clock edge. In some embodiments, while the training is ongoing, a single bit failure will disqualify this clock line to be invalid for capturing good data coming from the memory device. In some embodiments, there are two separate capturing components, one set running on positive clock edges to capture data for positive clocks and another set running on negative clock edge to capture data for negative clock edges.

Figure 13:
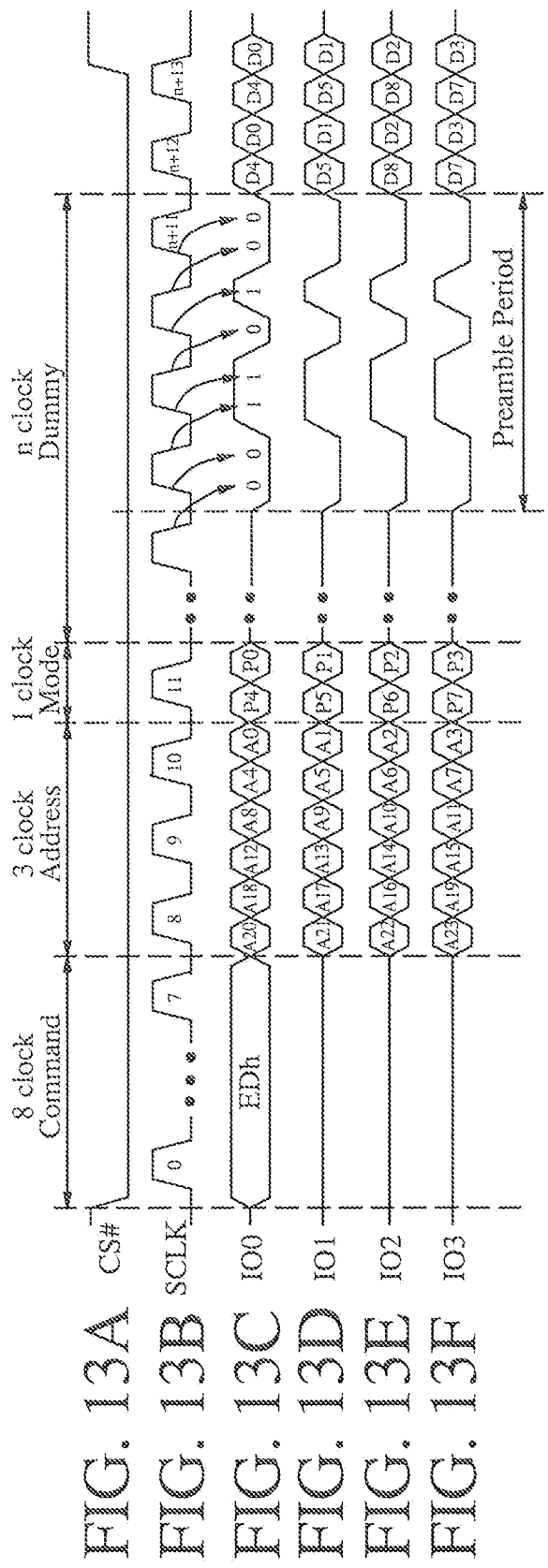
FIGS. 13A-F show a timing diagram of embodiments of signals for an embodiment of the system of FIG. 6.

FIGS. 13A-F show a timing diagram of embodiments of signals for an embodiment of system 600 of FIG. 6. FIG. 13A shows a waveform of chip select signal CS#. FIG. 13B shows a waveform of clock signal SCLK. FIGS. 13C-F show waveforms of input-output data lines 100-103, respectively.

The bus protocol shown in FIGS. 13A-F does not have the same possibility for contention that occurs in other memory interfaces but the length of the preamble does assume a minimum number of idle bus cycles. At higher frequencies the memory device initial latency allows for an adequate number of "dummy" cycles to present the preamble. At lower frequencies fewer idle clock cycles would be needed to satisfy the initial latency requirements. At a low enough frequency the host would tend to reduce the number of idle cycles to the point where the full preamble can no longer be presented. Extra dummy clock cycles may be inserted in some embodiments, but using the next clock edge rather than a training pattern is generally sufficient at lower clock frequencies where a full preamble cannot be presented, or a shorter preamble may be used at some clock frequencies.

Figure 14:
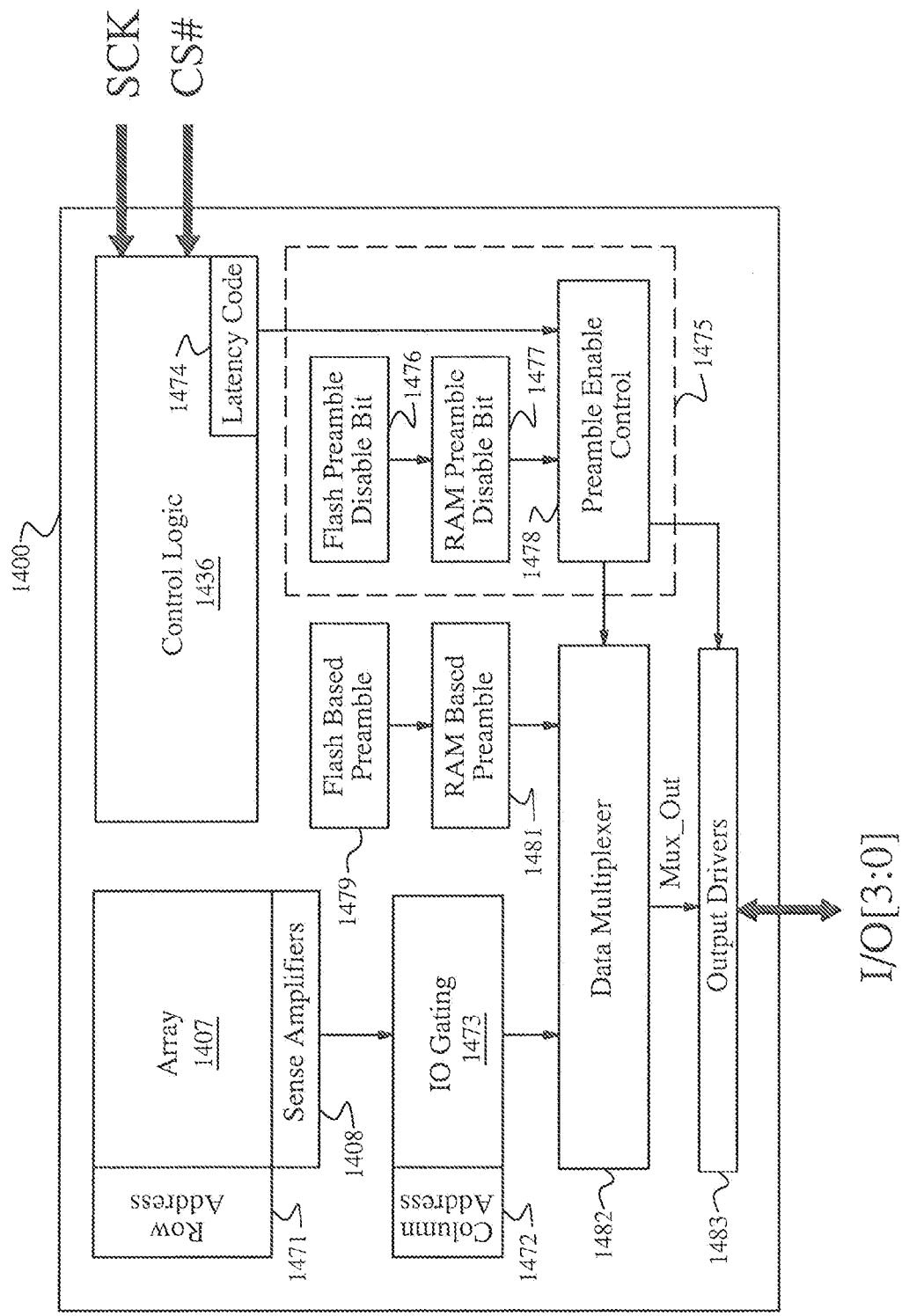
FIG. 14 illustrates a block diagram of an embodiment of the memory device of FIG. 2, 3, or 6.

FIG. 14 illustrates a block diagram of an embodiment of memory device 1400, which may be employed as an embodiment of memory device 600 of FIG. 6 (or, inter alia, memory device 200 of FIG. 2 or memory device 300 of FIG. 3). Memory device 1400 includes memory array 1407, row addresses 1471, sense amplifier 1408, control logic 1436, latency code register 1474, preamble disable component 1475, flash-based preamble 1479, RAM-based preamble 1481, data multiplexer 1482, and output drivers 1483. Preamble disable component 1475 includes flash preamble disable bit 1476, RAM preamble disable bit 1477, and preamble enable control 1478. The memory controller includes, inter alia, control logic 1436 and preamble enable control 1475.

The memory controller includes, inter alia, control logic 1436 and preamble enable control 1475.

Preamble disable component 1475 is configured to determine whether the preamble is to be driven onto the data bus. In various embodiments, different mechanisms can be used to disable the preamble from being driven onto the bus.

In some embodiments, a single non-volatile bit is used to allow either the memory manufacturer or the system manufacturer to specify whether the preamble is enabled after a power-up. In some embodiments, the bit is flash-based (flash preamble disable bit 1476) and the state of the bit can be specified by either the memory manufacturer or the system manufacturer. In some embodiments, a locking strategy is incorporated to ensure that the flash bit's state can be made permanent.

In some embodiments, non-volatile bit 1476 might be used in conjunction with a RAM bit 1477 that can be updated by the host system after power-up. A locking strategy may be incorporated to assure that the RAM bit 1477 is made permanent until the next power-up.

Some embodiments employ a secondary disable mechanism. In some of these embodiments, preamble disable component 1475 automatically disables the preamble if the number of "dummy" clocks is not adequate to allow the complete preamble to be placed onto the bus. This mechanism uses the value stored in latency code register 1474 to determine whether the preamble is output during a read operation. Latency code register 1474 stores the latency code, which is an integer representing the time, in number of clock cycles, of the latency between when the target address is defined and when the data is first put on the bus. This is equal to the number (i.e., cardinality) of dummy clock cycles plus one or more additional clocks to allow for bus turnaround. Controller 1436 changes the latency code when the frequency of clock signal SCLK changes. Controller 1436 calculates the latency based on the known latency and the current frequency of clock signal SCLK. The latency code is rounded up if the result is fractional. Preamble disable component 1475 compares the latency code with the number of bits in the preamble (i.e., the bit length of the preamble). In these embodiments, preamble disable component 1475 inserts the preamble if the latency is great enough to fit all of the bits in the preamble.

In some embodiments, a flash backed RAM bit is employed as one of the mechanisms for enabling the preamble. Some embodiments use a RAM only mechanism, and other embodiments use a Flash only approach. Also, in some embodiments, the length of the preamble pattern is variable rather than fixed. In some embodiments with a variable length preamble, the latency code is compared with the preamble length to determine whether the preamble should be disabled. In some embodiments, preamble disable component 1475 has the ability for the host system to determine the state of the Flash Preamble Disable Bit 1476, the RAM Preamble Disable Bit 1477, and whether the chosen Latency Code will cause the preamble to be disabled.

In some embodiments, disabling of the read preamble is based on the mode that memory device 1400 is in. For example, in some embodiments, preamble disable component 1475 ensures that memory device 1400 boots up with the read preamble disabled. In these embodiments, there is a transition to a mode in which memory device 1400 operates at a higher clock rate. When the transition to higher clock rate occurs, preamble disable component 1475 enables the read preamble. When memory device 1400 is no longer in a mode in which the higher clock rate is used, preamble disable component 1475 disables the read preamble.

In some embodiments, the host controller specifies whether the read preamble should be enabled or disabled, and communicates this information to memory device 1400. In these embodiments, preamble disable component 1475 enables or disables the read preamble based on the communication from the host controller.

Preamble enable control component 1478 is configured to control data multiplexer 1482 based on one or more of the determinations discussed above. Under most operating conditions, data multiplexer 1482 provides data from IO gating 1473 to output driver 1483. During the time that the preamble should be presented during the dummy clock cycles, preamble enable control component 1478 controls data multiplexer 1482 to provide the preamble from flash-based preamble 1479 or RAM based preamble 1481 to output drivers 1483 if the determination was made that the preamble is enabled. This provides the preamble to output drivers 1483, which drive the preamble onto the I/O bus. If the preamble is disabled, data multiplexer 1482 continues to provide the output of IO gating 1473. Additional, during the dummy clock cycles, if the read preamble is disabled, preamble disable component 1475 also disables output drivers 1482 so that the bus is not driven during the dummy clock cycles.

Memory array 1407 stores the read data that is ultimately sent to the serial I/O data lines in response to a read command. Preamble enable control circuit 1475 is arranged to provide a preamble enable signal to the select input of data multiplexer 1482 based on the preamble disable bit. Data multiplexer 1482 is arranged to provide multiplexer output signal Mux_out at its output, by selecting one of its inputs (the read data provided at the output of IO Gating 1473 ultimately from array memory 1407), or the read preamble provided by preamble memory 1479 or 1481. Output drivers 1483 receive multiplexer output signal Mux_out and drive multiplexer output signal Mux_out onto the bus I/O[3:0] to driver multiplexer output signal Mux_out onto the bus when output drivers 1483 are enabled. During the dummy clock cycles, if the preamble is enabled, the read preamble is selected as data multiplexer output signal Mux_out and output drivers 1483 drive the read preamble onto the bus I/O[3:0]. During the dummy clock cycles, if the preamble is disabled, output drivers 1483 are disabled such that memory device 1400 does not drive the bus during the dummy clock cycles.

Figure 15:
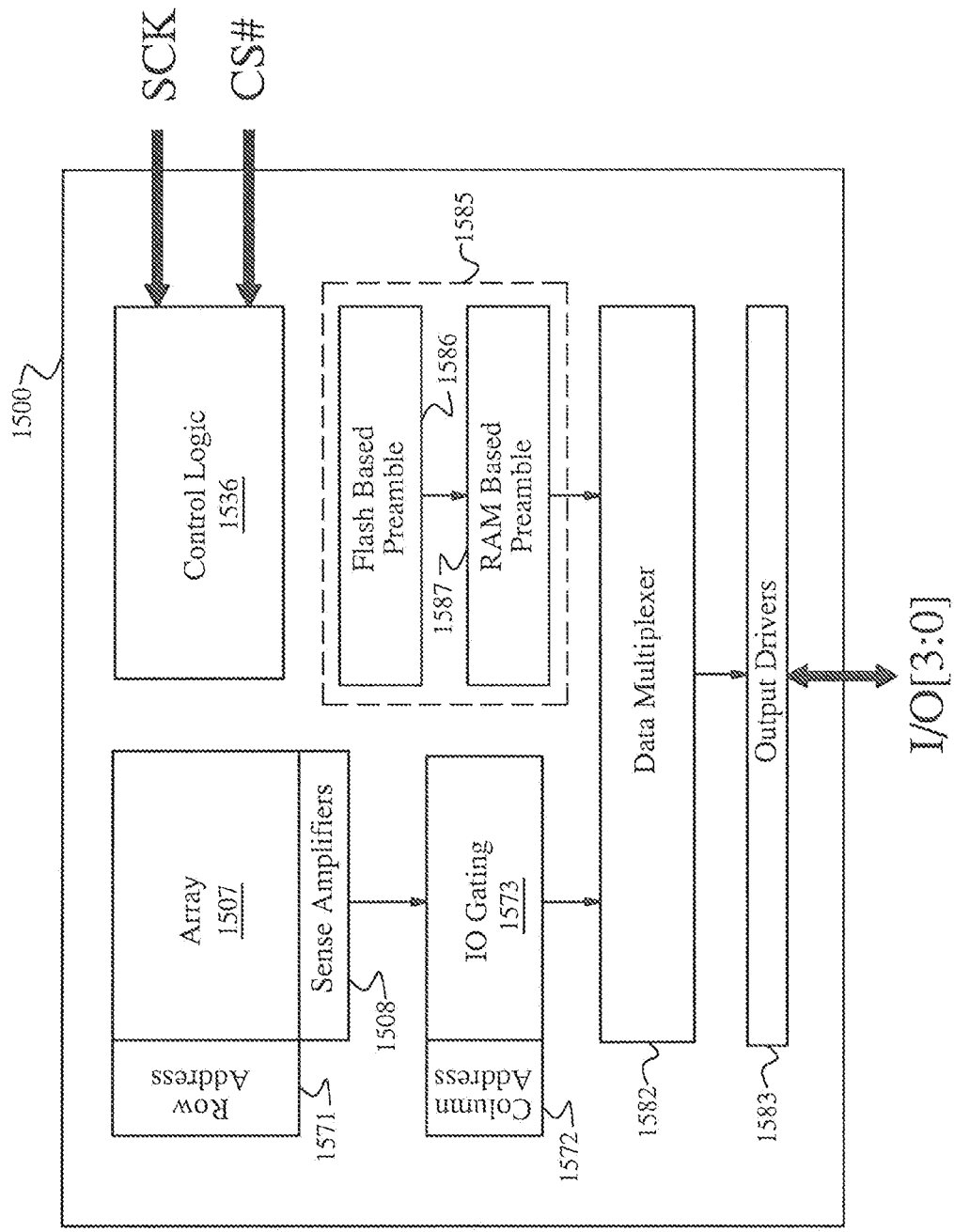
FIG. 15 shows a block diagram of another embodiment of the memory device of FIG. 2, 3, or 6.

FIG. 15 shows a block diagram of an embodiment of memory device 1500, which may be employed as an embodiment of memory device 600 of FIG. 6 (or, inter alia, memory device 200 of FIG. 2 or memory device 300 of FIG. 3). Memory device 1500 includes memory array 1507, row addresses 1571, sense amplifier 1508, control logic 1536, preamble component 1585, data multiplexer 1582, and output drivers 1583. Preamble component 1585 is an embodiment of preamble memory 285. In some embodiments, preamble component 1585 includes flash-based preamble 1586 and RAM-based preamble 1587.

Preamble component 1585 may be employed to specify the preamble pattern after memory device 1500 has been manufactured. Programmable memory in preamble component 1585 is used to allow either the memory manufacturer or the system manufacturer to specify the desired preamble pattern.

Some embodiments of memory device 1500 use both non-volatile memory and volatile memory to define the preamble pattern. For example, some embodiments of memory device 1500 use both flash memory and RAM to define the preamble pattern. In these embodiments, the RAM image is loaded upon power up with the preamble value stored in Flash-based preamble 1586 and could be altered after power-up by the host system. The Flash image could be programmed with the preamble pattern either by the memory manufacturer or by the system manufacturer.

In some embodiments, the preamble pattern is programmable in non-volatile memory, but not in volatile memory. For example, in some embodiments, the preamble pattern is programmable in flash memory, but not in RAM. These flash-only embodiments allow the pattern to be programmed either by the manufacturer or the OEM (original equipment manufacturer). In various embodiments, once the preamble is programmed it may be locked in some manner (reprogrammable or one-time programmable) or the value may be allowed to be erased and then reprogrammed.

In other embodiments, the preamble pattern is programmable in volatile memory, but not in non-volatile memory. For example, in some embodiments, the preamble pattern is programmable in RAM, but not in flash memory, and the host system defines the preamble value prior to using any read operation that includes the preamble in the protocol. In these embodiments, the host system loads the preamble pattern after every power-up.

In yet other embodiments, the preamble is programmable in non-volatile memory-backed volatile memory, so that the non-volatile memory is a backup preamble memory. For example, in some embodiments, the preamble is programmable in flash-backed RAM. In these embodiments, a RAM is used to define the preamble pattern but an initial RAM value is loaded from Flash during power-up, where the initial RAM value serves as a default read preamble. After power-up, the RAM value can be altered by the host system.

In some embodiments, a command based Flash to RAM transfer may also be allowed after power-up. In some embodiments, the Flash is locked in a manner similar to the "Flash-Only" embodiments discussed above. Further, in some embodiments, a locking mechanism is employed for the volatile RAM value until a device reset or the next power-up is a possibility.

In some embodiments, the preamble may be stored in registers. For example, in some embodiments which include a flash-based preamble, the preamble is stored in a lockable flash memory register that is not reachable through standard addressing. In other embodiments, the registers may be implemented in other ways.

In some embodiments of RAM-based preamble, the preamble is adjustable at power-up and then locked. In some embodiments of flash-based preamble, the preamble can be programmed once and then remains locked. In some embodiments, the lock media is adjustable so that the preamble could be changed at some point.

The preamble may be changed for different reasons in different embodiments. For example, different preambles may be preferable in different usage scenarios, such as a noisier bus versus a bus that does not have signaling issues. Another reason for programming the preamble to a particular value is that the host controller may be designed to accept only a particular preamble, so that memory device 1500 should be programmed to provide that particular preamble for that device. Another reason for programming the preamble is to provide security.

Although an 8-bit long preamble is discussed above, the invention is not so limited and longer and shorter lengths than eight bits may also be employed. Longer preambles would be attractive to more accurately calibrate the data capture point. Shorter preambles would be attractive in some circumstances to minimize the number of clocks required between the command/address definition and the initial data value. In some embodiments, the preamble bit length is also a programmable feature, in addition to programming the preamble itself. For example, in some embodiments, the bit length of the preamble is shortened at smaller clock rates, and/or the length of the preamble is increased at faster clock rates.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Embodiments of a memory device (such as memory devices 200 of FIG. 2, 300 of FIG. 3, 600 of FIG. 6, 1400 of FIG. 14, and/or 1500 of FIG. 15) can be incorporated into any of a variety of components and/or systems, including for example, a processor and other components or systems of such components. FIG. 16 shows one embodiment of system 1690, which may incorporate memory 1620, which is an embodiment of memory device 400 of FIG. 4. Memory 1620 can be directly or indirectly connected to any one of processor 1692, input devices 1693, and/or output devices 1694. In one embodiment, memory 1620 may be configured such that it is removable from system 1690. In another embodiment, memory 1620 may be permanently connected to the components or a portion of the components of system 1690.

In many embodiments, memory 1620, processor 1692, input devices 1693, and/or output devices 1694 of system 1690 are configured in combination to function as part of a larger system. For example, system 1690 may be incorporated into a cell phone, a handheld device, a laptop computer, a personal computer, and/or a server device. In addition or alternatively, system 1690 can perform any of a variety of processing, controller, and/or data storage functions, such as those associated with sensing, imaging, computing, or other functions. Accordingly, system 1690 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A memory device, comprising:
a preamble memory that is arranged to store a read preamble such that the read preamble includes two training patterns that are suitable for:
aligning a capture point for read data on two communication lines; and
determining a period of time within a clock cycle the read data is simultaneously available on the two communication lines,
wherein the training patterns can be altered at least once subsequent to manufacture of the preamble memory, wherein the preamble memory is configured such that the read preamble is programmable during power up, and further configured such the read preamble is locked after power up is complete; and
a memory controller that is configured, in response to a read command, to:
provide the read preamble stored in the preamble memory; and
provide the read data.

2. The memory device of claim 1, wherein
the preamble memory is further arranged such that a bit length of one of the two training patterns is programmable such that the bit length of the one of the two training patterns can be altered at least once subsequent to the manufacture of the preamble memory.

3. The memory device of claim 1, wherein
the memory controller is configured to provide the read data on the two communication lines in a bus immediately after a plurality of dummy clock cycles, and to provide the read preamble on the two communication lines in the bus during at least a portion of the plurality of dummy clock cycles.

4. The memory device of claim 1, wherein
the preamble memory includes means for programming the read preamble, or
the memory controller includes means for providing the read preamble stored in the preamble memory responsive to the read command.

5. The memory device of claim 1, wherein
the preamble memory is non-volatile memory.

6. The memory device of claim 5, wherein
the preamble memory is flash memory.

7. The memory device of claim 5, wherein
the memory controller is configured to lock the read preamble after the read preamble is programmed.

8. The memory device of claim 1, wherein
the preamble memory is volatile memory.

9. The memory device of claim 8, wherein
the preamble memory is random access memory.

10. The memory device of claim 1, further comprising:
a backup preamble memory that is arranged to store a default read preamble.

11. A memory device, comprising:
a preamble memory that is arranged to store a read preamble such that the read preamble includes a training pattern that is suitable for aligning a capture point for read data, wherein the training pattern can be altered at least once subsequent to manufacture of the preamble memory;
a memory controller that is configured to perform actions, including:
in response to a read command:
providing the read preamble stored in the preamble memory; and
providing the read data; and a backup preamble memory that is arranged to store a default read preamble, wherein the backup preamble memory is non-volatile memory, the preamble memory is volatile memory, the preamble memory stores the default read preamble from the backup preamble memory as the read preamble at power up of the memory device, and wherein the read preamble can be altered at least once subsequent to manufacture of the preamble memory after power up of the memory device.

12. The memory device of claim 11, wherein the backup preamble memory is configured such that the default read preamble is programmable such that the backup read preamble can be altered at least once subsequent to manufacture of the backup preamble memory.

13. The memory device of claim 11, wherein the backup preamble memory is flash memory.

14. The memory device of claim 11, wherein the preamble memory is random access memory.

15. A method, comprising:
storing a read preamble in a device such that the read preamble includes two training patterns that are suitable for:
aligning a capture point for read data on two communication lines; and
determining a period of time within a clock cycle the read data is simultaneously available on the two communication lines, wherein the read preamble is programmable during power up and the read preamble is locked after power up is complete;
altering the read preamble subsequent to manufacture of the device; and
in response to a read command:
providing the read preamble stored in the preamble memory; and
providing the read data.

16. The method of claim 15, further comprising:
adjusting a bit length of one of the training pattern at least once subsequent to the manufacture of the device.

17. A system, including:
a data capturing device that is configured to:
provide a read command;
receive a response to the read command; and
employ a read preamble to align a capture point for read data on two communication lines and determine a period of time within a clock cycle the read data is simultaneously available on the two communication lines; and
a memory device that is configured to:
store the read preamble such that the read preamble includes two training patterns that are suitable for:
aligning the capture point for the read data on the two communication lines; and
determining the period of time the read data is available on the two communication lines, wherein at least one of the two training patterns can be altered at least once subsequent to manufacture of the memory device, and wherein the read preamble is programmable during power up and the read preamble is locked after power up is complete; and
in response to the read command:
provide the read preamble stored in the memory device; and
provide the read data.

18. The system of claim 17, wherein
the memory device is further arranged such that a bit length of one of the training patterns is programmable such that the bit length of the one of the two training patterns can be altered at least once subsequent to the manufacture of the memory device.

* * * * *